Sept. 15, 1970 G. W. BARNES 3,529,277

INTEGRATED CIRCUIT CARRIER

Filed May 1, 1968

INVENTOR
GEORGE W. BARNES

BY Seidel & Gonda

ATTORNEYS.

United States Patent Office 3,529,277

Patented Sept. 15, 1970

3,529,277

INTEGRATED CIRCUIT CARRIER

George W. Barnes, Upper Darby, Pa., assignor to Barnes Corporation, Lansdowne, Pa., a corporation of Pennsylvania Filed May 1, 1968, Ser. No. 725,684

Int. Cl. H01r *13/60*

U.S. Cl. 339—119 1 Claim

ABSTRACT OF THE DISCLOSURE

A one-piece carrier is disclosed for a flat pack integrated circuit having integral side-biased latches or retention clips. The retention clips are positioned so as not to interfere with the entire exposure of both surfaces of the flat pack integrated circuit.

This invention relates to an integrated circuit carrier. More particularly, this invention relates to a carrier for a flat pack integrated circuit which permits both surfaces of the integrated circuit to be tntirely exposed.

Mainly because of their delicacy and size, integrated circuits require special handling techniques. Directly related to the handling techniques is the necessity for providing carriers which retain and protect the integrated circuit packages. These carriers provide a means by which the integrated circuit can be carefully handled and manipulated for marking, testing, final packaging, an connection of the package to circuit boards or the like. The carriers have a dual function. Their first function is to retain and protect the integrated circuit. The second function, which is related to the first function, is to retain the integrated circuit in a manner that permits it to be operated on by automated testing and marking apparatus or the like as well as to provide means for manipulating them during manufacturing and installation.

Prior art carriers for flat pack integrated circuits usually include two interlocking pieces designed to retain the flat pack integrated circuit between them. One prior art type of carrier includes a base having a plurality of aligned, adjacent grooves to retain the leads protruding from the integrated circuit body. The second piece fits over the integrated circuit body and interlocks with the base to thereby retain it in position. There are several distinct disadvantages to this type of flat pack carrier. Since it is made of two pieces, it requires additional handling steps to lock the integrated circuit in position. Moreover, the interlocking pieces of necessity overlie a large portion of the integrated circuit body, if not all of it, precisely where it is desirable to have it exposed. If the integrated circuit can be fully exposed, then certain additional operating steps can be sequenced into the handling equipment. For example, the marking step can be combined into the manufacturer's testing of the integrated circuit.

In accordance with the present invention, the clips for retaining the circuit on the carrier provide positive retention rather than frictional retention. The clips do not make contact with the sealed or encapsulated integrated circuit body, thereby avoiding contamination and/or breakage of the body. In addition, the clips are structurally interrelated in a manner whereby the circuit may be separated from the carrier by mechanical means automated or otherwise.

It is an object of the present invention to provide an integrated circuit carrier which will retain the integrated circuit while leaving entirely exposed both surfaces of the integrated circuit body and one side of its leads.

It is another object of the present invention to provide an integrated circuit carrier which will releasably retain the integrated circuit on the carrier without contacting the integrated circuit body.

It is another object of the present invention to provide an integrated circuit carrier which will retain an integrated circuit in a positive manner and be capable of being separated from the carrier by use of mechanical devices.

It is yet another object of the present invention to provide an integrated circuit carrier having retention means which may be readily modified to retain the integrated circuit by engaging its body instead of its leads.

Other objects will appear hereinafter.

For the purpose of illustrating the invention, there is shown in the drawings a form which is presently preferred; it being understood, however, that this invention is not limited to the precise arrangements and instrumentalities shown.

Referring to the drawing in detail, wherein like numerals indicate like elements, there is shown a flat pack integrated circuit carrier designated generally as 10.

Figures 1, 2, 3, 4, 5, 6:
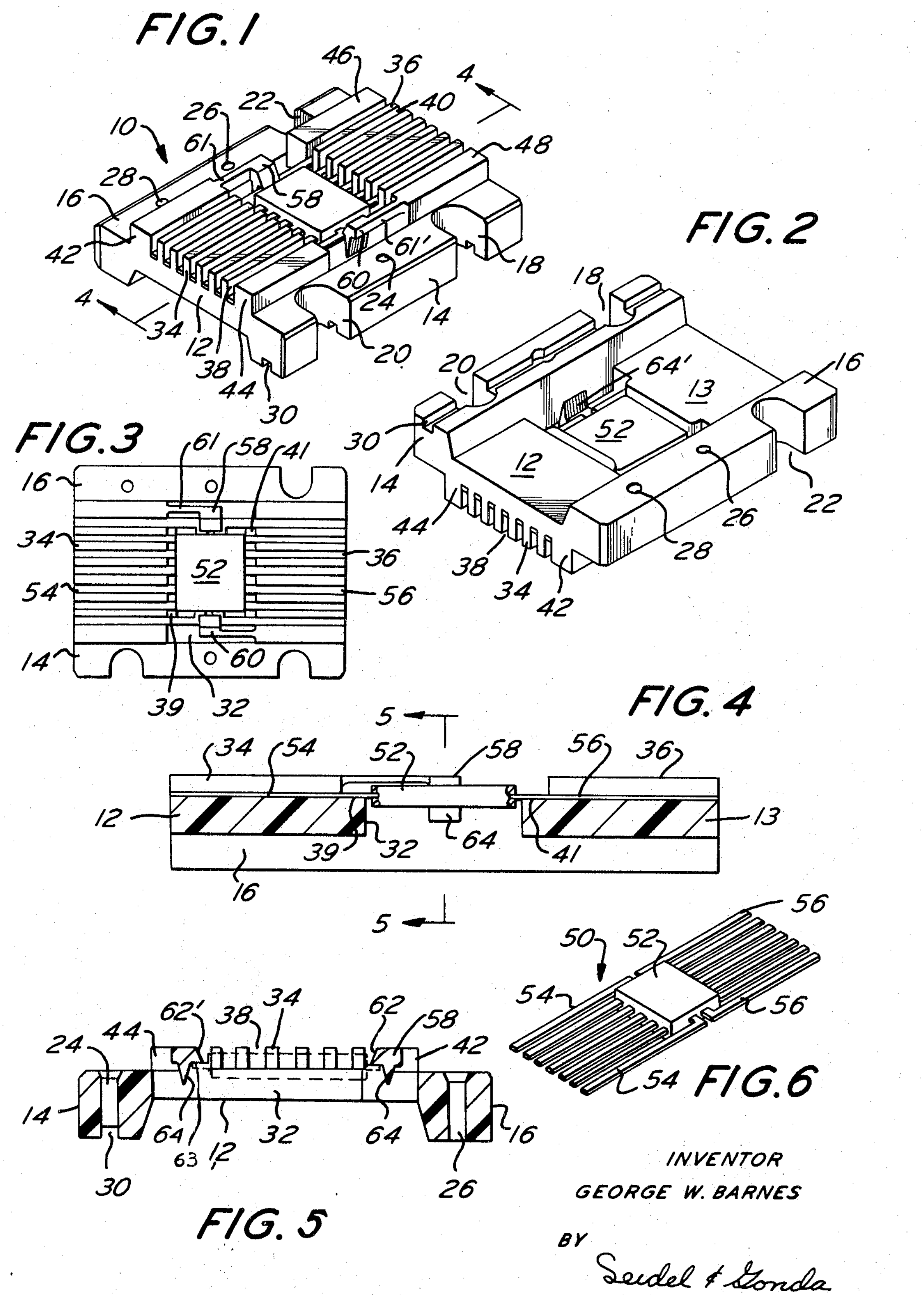
FIG. 1 is a top perspective view of the integrated circuit carrier in accordance with the present invention showing a flat pack integrated circuit retained thereon.
FIG. 2 is a bottom perspective view of the subject matter illustrated in FIG. 1.
FIG. 3 is a top plan view of the subject matter illustrated in FIG. 1.
FIG. 4 is a sectional view taken along the line 4—4 in FIG. 1.
FIG. 5 is a sectional view taken along the line 5—5 in FIG. 4.
FIG. 6 is a perspective view of a flat pack integrated circuit.

The carrier 10 consists of a rectangular one-piece integral structure comprising a base 12 and a base 13 integral with flanges 14 and 16. The flanges 14 and 16 provide the means whereby the carrier 10 may be manipulated either manually or automatically. In this regard, the flange 14 is provided with polarization notches 18 and 20 and flange 16 is provided with a polarization notch 22. The notches 18, 20, and 22 are generally U-shaped to cooperate with circular indexing poles well known to those skilled in the art.

Those skilled in the art will readily recognize that there is no limitation to the shape of the notches 18, 20 and 22. The function of the notches to correctly index the carrier for cooperation with mechanical machine handling equipment is well known. Accordingly, it need not be described in detail.

A hole 24 is provided in flange 14 and holes 26 and 28 are provided in flange 16. A slot 30 is provided in the flange 14. These holes and slots likewise provide a means for cooperation with mechanical handling equipment in a well-known manner. The position, number and type of notches, holes and slots provided in the carrier 10 is basically a matter of requirements necessary to make the carrier suitable for fully mechanized loading, feeding, sorting, marking, testing and classification. Because they play no part in the present invention, they are not described in detail.

The base 12 is spaced from the base 13 so as to define an opening 32. The base 12 is provided with integral, spaced, parallel, longitudinally extending walls 34 spaced from one another by grooves 38. The base 13 is provided with similar walls 36 spaced from one another by grooves 40. The walls and grooves on the base 12 are aligned with the corresponding walls and grooves on the base 13.

The spacing between the individual walls 34 and 36 to define the grooves 38 and 40 is sufficient to permit the leads extending from a flat pack integrated circuit to be disposed between them and supported by the spaces 12 and 13. Preferably, the width of each individual groove is only slightly more than the width of the leads extending from the integrated circuit. It will be noted that the length of walls 34 is less han the length of the base 12 so as to define a support surface 39 adjacent the opening 32. A similar support surface 41 is provided on the base 13 adjacent the opening 32. As shown more clearly in FIG. 3, the length of the surfaces 39 and 41 across the width of the bases 12 and 13 is less than the length of the opening 32. The relative dimensions shown in the drawing are variable for accommodating and centering integrated circuits of varying dimensions.

As shown in the drawing, the outermost walls 42, 44, 46 and 48 adjacent the flanges 14 and 16 are wider than the remaining walls 34 and 36. This provides reinforcement and protection for the relatively thin walls 36 and 38.

By way of example, but not limitation, the carrier 10 thus far described could have the following dimensions. Those skilled in the art will recognize that the dimensions can be varied in accordance with the type of circuit to be supported. The overall length of the carrier 10 may be 1 inch and its overall width 0.75 inch. The length of the openings 32 between the end face of the surfaces 39 and 41 may be 0.35 inch. The width of the opening 32 between the flanges 14 and 16 may be .476 inch. The height of the flanges 14 and 16 may be 0.131 inch and the height of the walls 34, 36 and 40–38 above the bases 12 and 13 may be 0.055 inch.

Preferably, the grooves 38 and 40 are slightly V-shaped with the width at the base being 0.027 inch with the width of the top being approximately 0.032 inch. There are six walls 34 and six walls 36 which combine with the walls 42–48 to define seven grooves on each side of the opening 32 for receiving fourteen leads. The polarization notches 18, 20 and 22 may be 0.126 inch wide. The holes 24, 26 and 28 may be 0.050 inch in diameter. The slot 30 in flange 14 may be 0.035 inch wide and 0.035 inch in height so as to be a square slot.

A typical flat pack integrated circuit 50 is shown in FIG. 6. The circuit 50 includes an integrated circuit body 52 having seven leads 54 projecting therefrom in one direction and seven leads 56 projecting in the opposite direction. As previously indicated, to be effective, each carrier must include a means for retaining the integrated circuit in position. Normally, this is some form of clip which cooperates with the base by engaging it in the opening 32 after the integrated circuit has been fitted into the grooves 38 and 40.

In accordance with the present invention, the integrated circuit 50 is retained within the carrier 10 by resilient engaging means comprised of first and second latches 58 and 60. Latch 58 is integral at one end with wall 44. Latch 60 is integral at one end with wall 48. The latches 58 and 60 form an extension of their respective walls. The latches are identical. Hence, only latch 58 will be described in detail. Corresponding primed numerals will be provided for the corresponding structure on latch 60.

Latch 58 includes a support arm 61 extending from wall 32 in the direction of wall 42. Arm 61 is a cantilever arm. At its free end, it extends inwardly toward the flange 14 and is provided with a cam surface 62. The cam surfaces 62 and 62′ converge downwardly to a horizontal support surface of about 0.0017 square inch adapted to overlie adjacent ends of leads 54 and 56. From the horizontal surface, the latch 58 is provided with a second cam surface 64. The cam surfaces 64 and 64′ converge upwardly. See FIG. 5.

The inwardly projecting portions at the free end of the arms 61 and 61′ are of sufficient length so as to overlie a portion of each of the leads 54 and 56. With the circuit 50 in carrier 10 assembled as illustrated in the drawings, the latches 58 and 60 maintain the circuit 50 in a position wherein each of the leads 54 and 56 are firmly held against the bottom of its respective grooves 38 and 40. The circuit 50 is assembled into the carrier 10 by positioning the circuit 50 over the opening 32. Simultaneously or prior thereto the latches 58 and 60 are biased apart either manually or mechanically. This is done by engaging the cam surfaces 64 and 64′. The cam surfaces 64 and 64′ provide cam surfaces which may be engaged by mechanical devices to spread the latches 58 and 60 apart so that the circuit 50 may be inserted or separated from the carrier 10. Then the circuit 50 is dropped into the carrier. Thereafter, the latches 58 and 60 are released allowing them to spring back to the position illustrated in Figure 5 overlying a portion of each of the leads 54 and 56. Because the latches 58 and 60 do not contact the circuit body 52, there is a freedom of contamination of the body 52 and a minimizing of any possibility of breaking the body or its seals 52 when assembling the circuit to the carrier.

The entire carrier 10 may be made of a polymeric thermoplastic material. In the preferred embodiment, the plastic material may be a polysulfone. If desired, a thermosetting material could be used if the conditions of testing permit the same. In manufacturing the carrier 10 of the present invention, the plastic material chosen must have a certain amount of resiliency so that the arms 61 and 61′ on the latches will provide a spring-like biasing action. Polysulfone is one such plastic material capable of providing such action for the arms 61 and 61′.

FIG. 1 shows the flat pack integrated circuit 50 retained in the carrier 10. The flat pack integrated circuit 50 is completely exposed for all types of operations which may be performed on and including electrical testing and imprinting directly on the surface of body 52. Moreover, since the integrated circuit 50 lies partially within the opening 32, and below the upper surface on the walls 34 and 36, it is protected on all sides and in particular its leads 54 and 56 are protected within the grooves 38 and 40.

The carrier 10 has been described showing a preferred embodiment wherein the latches 58 and 68 engage the dogleg shaped leads 54 and 56. In the event that it is desired to use the carrier to support an integrated circuit which has no leads projecting from the sides of the body, the latches 58 and 60 as well as their supporting arms 61 and 61′ can be readily repositioned so the latches overlie a small portion of the circuit body.

There are many uses to which the carrier 10 with the integrated circuit 50 mounted therein may be put. A wide variety of such uses will suggest themselves to those skilled in the art.

The present invention may be embodied in other specific forms without departing from the spirit or essential attributes thereof and, accordingly, reference should be made to the appended claims, rather than to the aforegoing specification as indicating the scope of the invention.

It is claimed:

1. A one piece integral carrier for an integrated circuit comprising a rectangular base having lateral flanges, said lateral flanges including machine handling means, a centrally located opening in said base, a plurality of opposed parallel longitudinally extending walls on opposite sides of said opening defining grooves for receiving leads extending from an integrated circuit, and resilient retention means for retaining an integrated circuit on said carrier, said retention means including first and second latches disposed on opposite lateral sides of said opening, said latches being resiliently supported by cantilevered arms extending from said walls, and downwardly converging cam surfaces on said latches for biasing said latches apart upon insertion of an integrated circuit into said carrier.

References Cited

UNITED STATES PATENTS

| | | | |
|---|---|---|---|
| 3,241,094 | 3/1966 | Harton | 339—91 X |
| 3,391,383 | 7/1968 | Antes | 339—174 |
| 3,407,717 | 10/1968 | Ernisse | 339—91 X |
| 3,409,861 | 11/1968 | Barnes et al. | 339—174 |

RICHARD E. MOORE, Primary Examiner

U.S. Cl. X.R.

339—174